(12) United States Patent
Yoshida

(10) Patent No.: US 12,487,076 B2
(45) Date of Patent: Dec. 2, 2025

(54) MEASUREMENT DEVICE, MEASUREMENT METHOD, AND BONDING SYSTEM

(71) Applicant: Yamaha Robotics Co., Ltd., Tokyo (JP)

(72) Inventor: Shinichi Yoshida, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 97 days.

(21) Appl. No.: 18/032,564

(22) PCT Filed: Oct. 19, 2020

(86) PCT No.: PCT/JP2020/039286
§ 371 (c)(1),
(2) Date: Apr. 18, 2023

(87) PCT Pub. No.: WO2022/085051
PCT Pub. Date: Apr. 28, 2022

(65) Prior Publication Data
US 2023/0392921 A1    Dec. 7, 2023

(51) Int. Cl.
*G01B 11/06*    (2006.01)
*G01B 11/24*    (2006.01)
*H05K 13/04*    (2006.01)

(52) U.S. Cl.
CPC ....... *G01B 11/0608* (2013.01); *H05K 13/046* (2013.01); *G01B 11/24* (2013.01)

(58) Field of Classification Search
CPC ... G01B 11/0608; G01B 11/24; G01B 11/306; H05K 13/046; H01L 2224/75901; H01L 2224/81908; H01L 24/75
See application file for complete search history.

(56) References Cited

U.S. PATENT DOCUMENTS

2018/0102340 A1*    4/2018    Kim ................... H01L 24/75

FOREIGN PATENT DOCUMENTS

| JP | H0494552 | 3/1992 |
|---|---|---|
| JP | H07110966 | 4/1995 |

(Continued)

OTHER PUBLICATIONS

"International Search Report (Form PCT/ISA/210) of PCT/JP2020/039286", mailed on Dec. 8, 2020, with English translation thereof, pp. 1-4.

(Continued)

*Primary Examiner* — Thanh Luu
*Assistant Examiner* — Mai Thi Ngoc Tran
(74) *Attorney, Agent, or Firm* — JCIPRNET

(57) ABSTRACT

The present invention can provide a measurement device, a measurement method, and a bonding system, which enable estimation of the state of the underside of an electronic component mounted on a substrate. A measurement device performs measurements on an electronic component that is mounted on a main surface of a substrate, the measurement device comprising: a measurement part that measures a component height position, which is the height of the upper surface of the electronic component, and a substrate height position, which is the height of a non-mount region of the main surface of the substrate where the electronic component is not mounted; and an estimation part that estimates position information relating to a mount region of the main surface of the substrate where the electronic component is mounted, on the basis of the component height position and the substrate height position as measured by the measurement part.

11 Claims, 10 Drawing Sheets

(56) References Cited

FOREIGN PATENT DOCUMENTS

| | | | |
|---|---|---|---|
| JP | 2002176292 | | 6/2002 |
| JP | 2010186940 | * | 2/2009 |
| KR | 20090044485 | | 5/2009 |

OTHER PUBLICATIONS

"Office Action of Taiwan Counterpart Application", issued on Oct. 3, 2022, with partial English translation thereof, p. 1-p. 13.
"First Office Action Notification of China Counterpart Application", issued on Feb. 12, 2025, with English translation thereof, pp. 1-24.
"Second Office Action Notification of China Counterpart Application", issued on Jun. 14, 2025, with English translation thereof, pp. 1-19.
"Office Action of Korea Counterpart Application", issued on Jun. 27, 2025, with English translation thereof, pp. 1-8.

* cited by examiner

MEASUREMENT DEVICE, MEASUREMENT METHOD, AND BONDING SYSTEM

CROSS-REFERENCE TO RELATED APPLICATION

This application is a 371 application of the International PCT application serial no. PCT/JP2020/039286, filed on Oct. 19, 2020. The entirety of the above-mentioned patent application is hereby incorporated by reference herein and made a part of this specification.

TECHNICAL FIELD

The present invention relates to a measurement device, a measurement method, and a bonding system.

RELATED ART

Conventionally, there is known a method for measuring the degree of warpage of a semiconductor silicon substrate or the like. For example, Patent Literature 1 describes a method for measuring the degree of warpage and direction of warpage of a substrate by guiding a laser beam in parallel along the substrate and measuring the amount of change in vignetting of the laser beam due to the degree of warpage of the substrate.

CITATION LIST

Patent Literature

[Patent Literature 1] Japanese Patent Laid-Open No. 7-110966

SUMMARY OF INVENTION

Technical Problem

However, if there is an electronic component such as a semiconductor chip mounted on the substrate, the region of the substrate where the electronic component is mounted is not irradiated with the laser beam, and the warpage of the substrate in that region cannot be measured. Therefore, with the technique described in Patent Literature 1, it is not possible to measure the state of the lower surface side of the electronic component mounted on the substrate.

Accordingly, an object of the present invention is to provide a measurement device, a measurement method, and a bonding system that make it possible to estimate the state of the lower surface side of an electronic component mounted on a substrate.

Solution to Problem

A measurement device according to one aspect of the present invention is provided for performing measurement on an electronic component mounted on a main surface of a substrate.

The measurement device includes: a measurement part measuring a component height position, which is a height position of an upper surface of the electronic component, and a substrate height position, which is a height position of a non-mount region of the main surface of the substrate where the electronic component is not mounted; and an estimation part estimating position information related to a mount region of the main surface of the substrate where the electronic component is mounted based on the component height position and the substrate height position measured by the measurement part.

According to this aspect, the position information of the region where the electronic component is mounted can be estimated based on the measurable component height position and substrate height position. Thus, it is possible to estimate the state of the lower surface side of the electronic component mounted on the substrate.

In the above aspect, the measurement part may measure the component height position and the substrate height position respectively at a plurality of measurement points along a first direction in a plan view of the main surface of the substrate, and the estimation part may estimate the position information in a direction along the first direction based on the plurality of measurement points of each of the component height position and the substrate height position measured by the measurement part.

According to this aspect, the position information in the direction along the first direction is estimated, and it is possible to estimate the state of the lower surface side of the electronic component in more detail.

In the above aspect, the measurement part may respectively measure the component height position and the substrate height position at a plurality of measurement points along a direction of each of the first direction and a second direction intersecting the first direction in the plan view, and the estimation part may estimate the position information in a direction along each of the first direction and the second direction based on the plurality of measurement points of each of the component height position and the substrate height position measured by the measurement part.

According to this aspect, the position information in the direction along each of the first direction and the second direction is estimated, and it is possible to estimate the state of the lower surface side of the electronic component in more detail.

In the above aspect, the plurality of measurement points of the substrate height position may be located at positions extending along an edge of the mount region.

According to this aspect, information on the substrate in the mount region is more strongly reflected in the substrate height position at the position extending along the edge of the mount region. Therefore, according to this aspect, it is possible to more accurately estimate the state of the lower surface side of the electronic component.

In the above aspect, the position information may include information related to inclination of the electronic component with respect to the substrate in the mount region.

According to this aspect, it is possible to more appropriately adjust the inclination between the electronic component and the substrate during bonding.

In the above aspect, the measurement part may measure the component height position by irradiating the upper surface of the electronic component with light and detecting reflected light from the upper surface of the electronic component, and measure the substrate height position by irradiating the non-mount region with light and detecting reflected light from the non-mount region.

According to this aspect, since it is possible to measure the height position without directly touching the electronic component or the substrate, the occurrence of damage to the electronic component and the substrate when measuring the height position is suppressed.

A bonding system according to another aspect of the present invention includes: the measurement device; and a bonding apparatus acquiring the position information estimated by the measurement device, adjusting inclination between the electronic component and the substrate based on the position information acquired, and bonding the electronic component and the substrate.

According to this aspect, since the inclination between the electronic component and the substrate can be adjusted more appropriately, it is possible to more accurately bond the electronic component and the substrate.

A measurement method according to another aspect of the present invention is provided for measuring an electronic component mounted on a main surface of a substrate. The measurement method includes: measuring a component height position, which is a height position of an upper surface of the electronic component, and a substrate height position, which is a height position of a non-mount region of the main surface of the substrate where the electronic component is not mounted; and estimating position information related to a mount region of the main surface of the substrate where the electronic component is mounted based on the component height position and the substrate height position measured.

According to this aspect, the position information of the region where the electronic component is mounted can be estimated based on the measurable component height position and substrate height position. Thus, it is possible to estimate the state of the lower surface side of the electronic component mounted on the substrate.

Effects of Invention

According to the present invention, it is possible to provide a measurement device, a measurement method, and a bonding system that make it possible to estimate of the state of the lower surface side of an electronic component mounted on a substrate.

DESCRIPTION OF EMBODIMENTS

Preferred embodiments of the present invention will be described with reference to the accompanying drawings.

Figure 1:
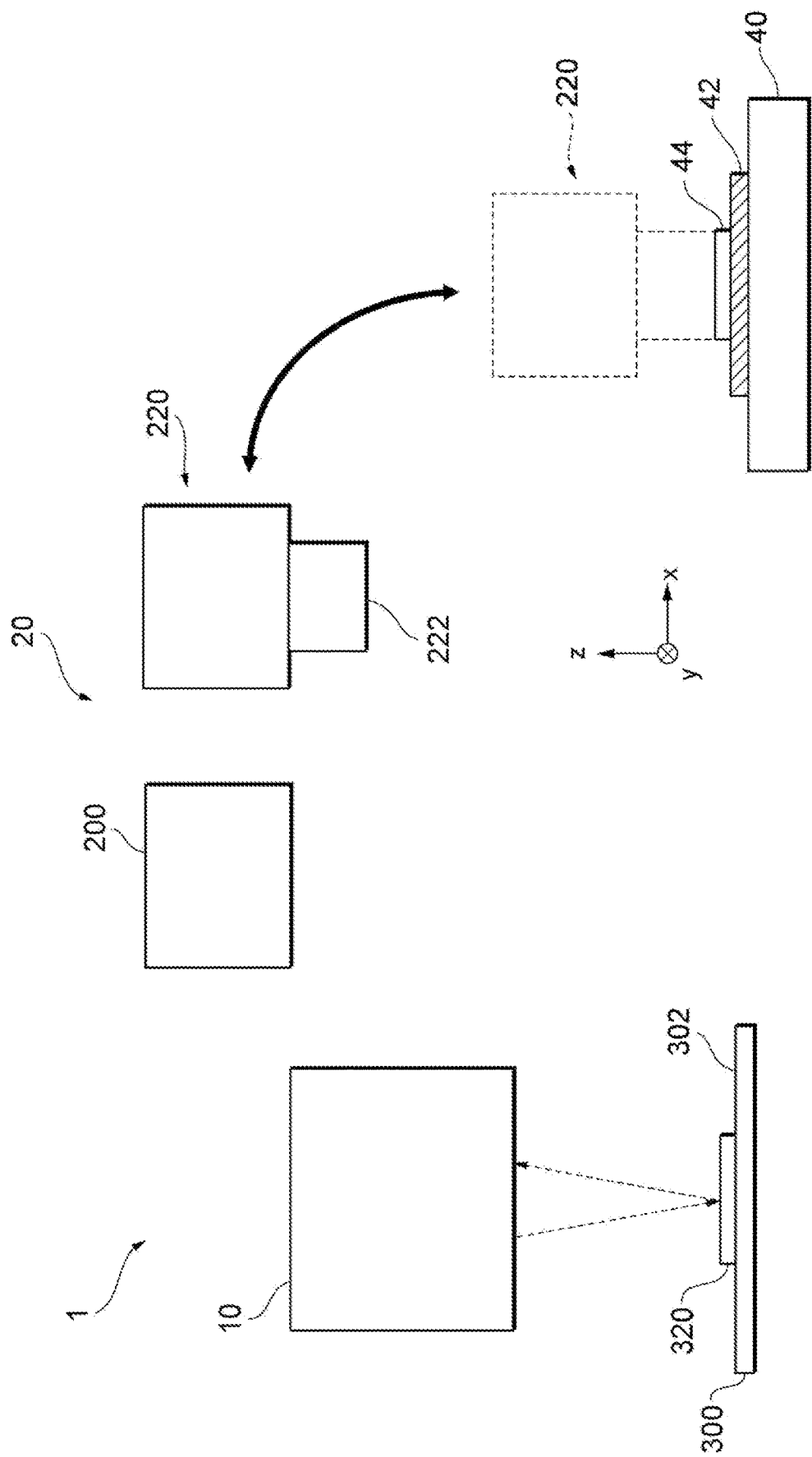
FIG. 1 is a diagram showing an example of the configuration of the bonding system according to an embodiment of the disclosure.

FIG. 1 is a diagram showing an example of the configuration of a bonding system 1 according to an embodiment of the disclosure. The bonding system 1 performs measurement on an electronic component mounted on a substrate, performs estimation based on the result of the measurement, and bonds the electronic component and the substrate based on the estimation result.

The electronic component according to this embodiment may be, for example, a passive element such as a capacitor, an inductor, and a resistor, or an active element such as a diode, a thyristor, a piezoelectric component, and an integrated circuit element. The shape of the electronic component is not particularly limited, and may have, for example, a flat upper surface. The electronic component is, for example, a surface mount electronic component. A case where the electronic component is a semiconductor chip including an integrated circuit will be described below as an example.

As shown in FIG. 1, the bonding system 1 according to the disclosure includes a measurement device 10 and a bonding apparatus 20. The measurement device 10 is a device that performs measurement on a semiconductor chip 320 mounted on a main surface 302 of a substrate 300. Details of the functions of the measurement device 10 will be described later with reference to FIG. 2 to FIG. 5.

The bonding apparatus 20 is an apparatus that bonds a semiconductor chip 44 and a substrate 42. This embodiment illustrates an example in which the bonding apparatus 20 bonds the semiconductor chip 44 and the substrate 42 by flip-chip bonding. Here, flip-chip bonding is a method of arranging an electrode formation surface provided on the semiconductor chip 44 to face the substrate 42 and bonding the bumps on the electrodes to the substrate 42 by, for example, soldering or the like.

The bonding apparatus 20 according to this embodiment includes a control device 200, a bonding drive mechanism (not shown in FIG. 1), and a bonding head 220. The control device 200 can control the bonding drive mechanism to move the bonding head 220 connected to the bonding drive mechanism or change the orientation of the bonding head 220. More specifically, the control device 200 can move the bonding head 220 along three axes, that is, x, y, and z axes shown in FIG. 1, rotate the bonding head 220 around the z-axis or tilt the bonding head 220 with respect to the z-axis. Further, the control device 200 can suck the semiconductor chip 44 to a lower surface 222 of the bonding head 220.

The control device 200 moves the bonding head 220 with the semiconductor chip 44 sucked thereto to place the semiconductor chip 44 on the main surface of the substrate 42 arranged on the upper surface of a stage 40. At this time, for example, the substrate 42 and the semiconductor chip 44 are heated, so that the solder or the like provided on the semiconductor chip 44 melts, and the substrate 42 and the semiconductor chip 44 are bonded. Details of the functions of the control device 200 according to this embodiment will be described later with reference to FIG. 8.

Figure 2:
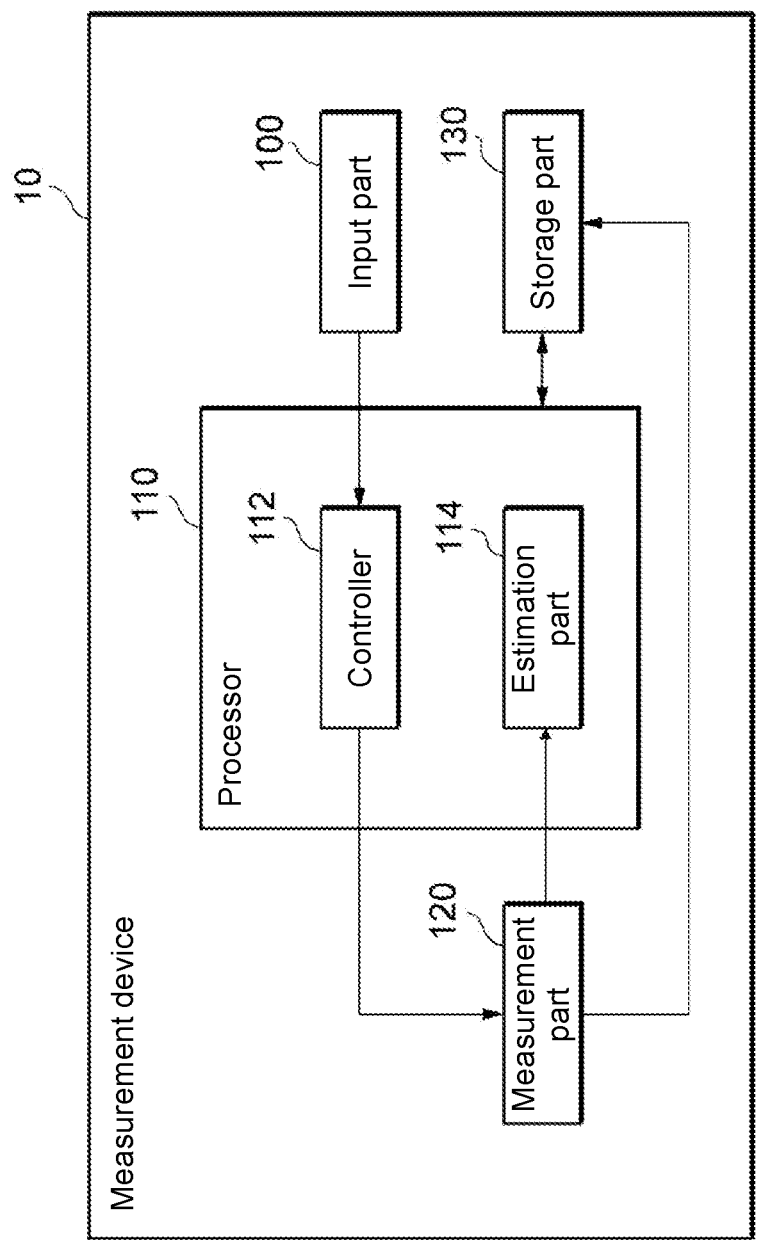
FIG. 2 is a functional block diagram showing an example of the functions of the measurement device according to the embodiment.

FIG. 2 is a functional block diagram showing an example of the functions of the measurement device 10 according to this embodiment. As shown in FIG. 2, the measurement device 10 according to this embodiment includes an input part 100, a processor 110, a measurement part 120, and a storage part 130.

The input part 100 receives an input operation of data from a user, and may include, for example, various buttons, a mouse, a keyboard, and a touch panel.

The input part 100 generates various types of input information according to the input operation of the user, and transmits the generated input information to the processor 110. The input part 100 generates, for example, information for instructing the start of measurement or information for specifying the range in which the measurement device 10 performs measurement.

The processor 110 includes a CPU (Central Processing Unit), a ROM (Read Only Memory), a RAM (Random Access Memory), etc. The ROM of the processor 110 stores processing programs or the like for executing various types of processing. Further, the CPU executes the processing programs or the like stored in the ROM to execute various types of processing. The RAM of the processor 110 stores data temporarily used during execution of various programs.

The processor 110 executes various types of processing. For example, the processor 110 controls the measurement performed by the measurement part 120 or performs the estimation based on the measurement result of the measurement part 120. The functions of the processor 110 are implemented by a controller 112 and an estimation part 114.

The controller 112 controls the timing, position, speed, etc. at which the measurement part 120 performs measurement. In addition, the estimation part 114 can execute estimation based on the measurement result of the measurement part 120. Details of the functions of the estimation part 114 will be described later.

Figure 3:
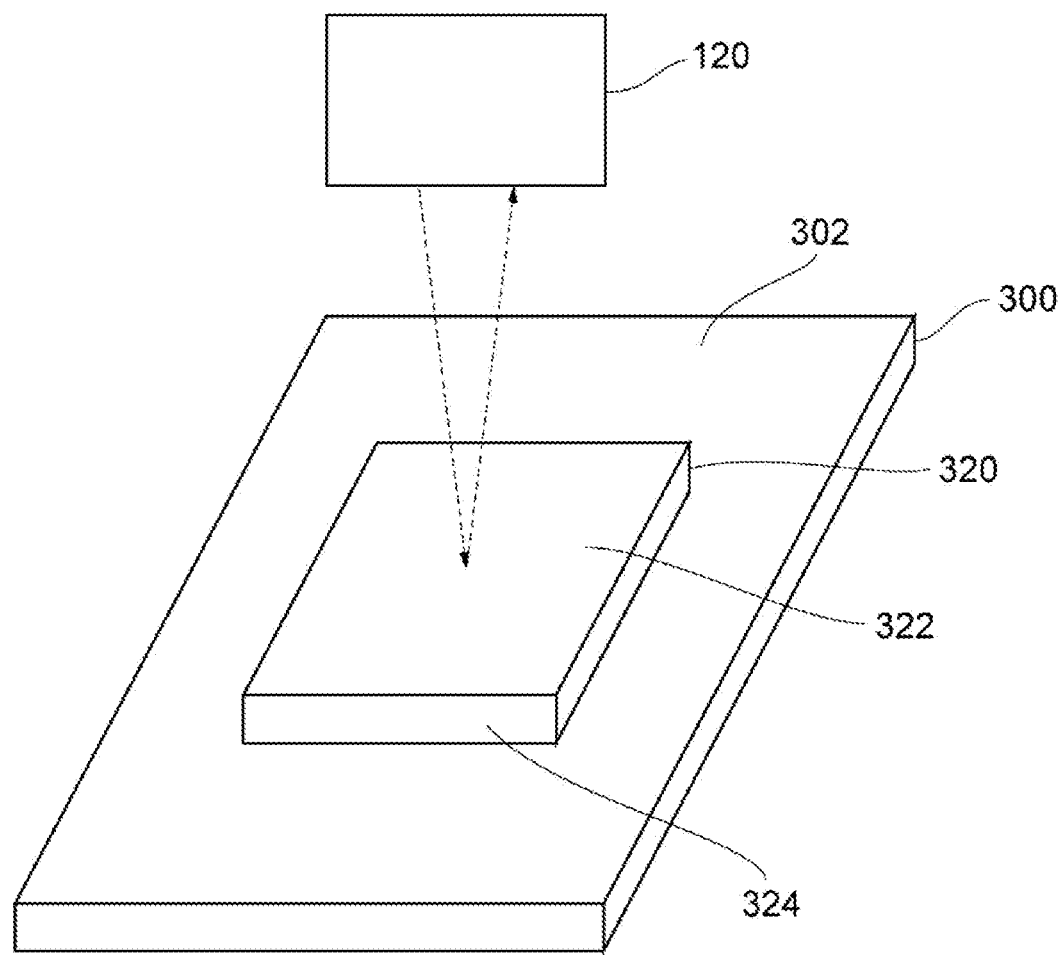
FIG. 3 is a diagram showing an example of how the measurement part according to the embodiment measures the height position.

The measurement part 120 performs measurement on the semiconductor chip mounted on the main surface of the substrate. Here, a measurement method performed by the measurement part 120 will be described with reference to FIG. 3 and FIG. 4. FIG. 3 is a diagram showing an example of how the measurement part 120 according to this embodiment measures a height position.

FIG. 3 shows a substrate 300, a semiconductor chip 320 mounted on the main surface 302 of the substrate 300, and the measurement part 120. The substrate 300 and the semiconductor chip 320 may have, for example, a substantially rectangular parallelepiped shape. Here, although one semiconductor chip 320 is shown in FIG. 3 for ease of description, a plurality of semiconductor chips may be mounted on the main surface 302 of the substrate 300. For example, semiconductor chips may be respectively mounted on the main surface 302 of the substrate 300 at different positions on the xy plane.

Furthermore, the x-axis direction shown in FIG. 3 (hereinafter also referred to as "first direction") is a direction parallel to the main surface 302 of the substrate 300 and one side 324 of the upper surface 322 of the semiconductor chip 320. In addition, the y-axis direction (hereinafter also referred to as "second direction") is orthogonal to the x-axis direction, and the z-axis direction is orthogonal to the x-axis direction and the y-axis direction.

Here, the substrate 300 and the semiconductor chip 320 may be bonded by solder or the like provided between the substrate 300 and the semiconductor chip 320, for example. In this case, since the substrate 300 and the semiconductor chip 320 are heated during bonding, the substrate 300 and the semiconductor chip 320 may undergo deformation such as warpage due to thermal expansion. In FIG. 3, deformation of the substrate 300 and the semiconductor chip 320 is omitted.

The measurement part 120 measures a chip height position, which is the height position of the upper surface of the semiconductor chip 320, and a substrate height position, which is the height position of a non-mount region of the main surface 302 of the substrate 300 where no semiconductor chip is mounted. Here, in this embodiment, the height position is a position in the z-axis direction.

The measurement part 120 may measure the height position of the measurement object by irradiating the measurement object with light and detecting reflected light from the measurement object. At this time, the measurement part 120 may measure the height position using, for example, a triangulation method.

The measurement part 120 may measure the chip height position by irradiating the upper surface 322 of the semiconductor chip 320 with light and detecting reflected light from the upper surface 322 of the semiconductor chip 320. Further, the measurement part 120 may measure the substrate height position by irradiating the non-mount region with light and detecting reflected light from the non-mount region. As described above, in this embodiment, since the measurement part 120 measures the height position using reflected light, damage to the substrate 300 and the semiconductor chip 320 is suppressed during measurement of the height position.

Further, the measurement part 120 may irradiate the non-mount region or the upper surface 322 of the semiconductor chip 320 with linear light (hereinafter also referred to as "line laser"), for example. The shape of the light irradiated by the measurement part 120 is not particularly limited, and the measurement part 120 may irradiate, for example, a spot-shaped laser or the like.

Moreover, the method of measuring the height position is not limited to the method of irradiating the measurement object with light and detecting reflected light from the measurement object. For example, the height position may be measured by using a measurement instrument such as a micrometer and bringing the measurement instrument into contact with the substrate 300 and the semiconductor chip 320.

Figure 4:
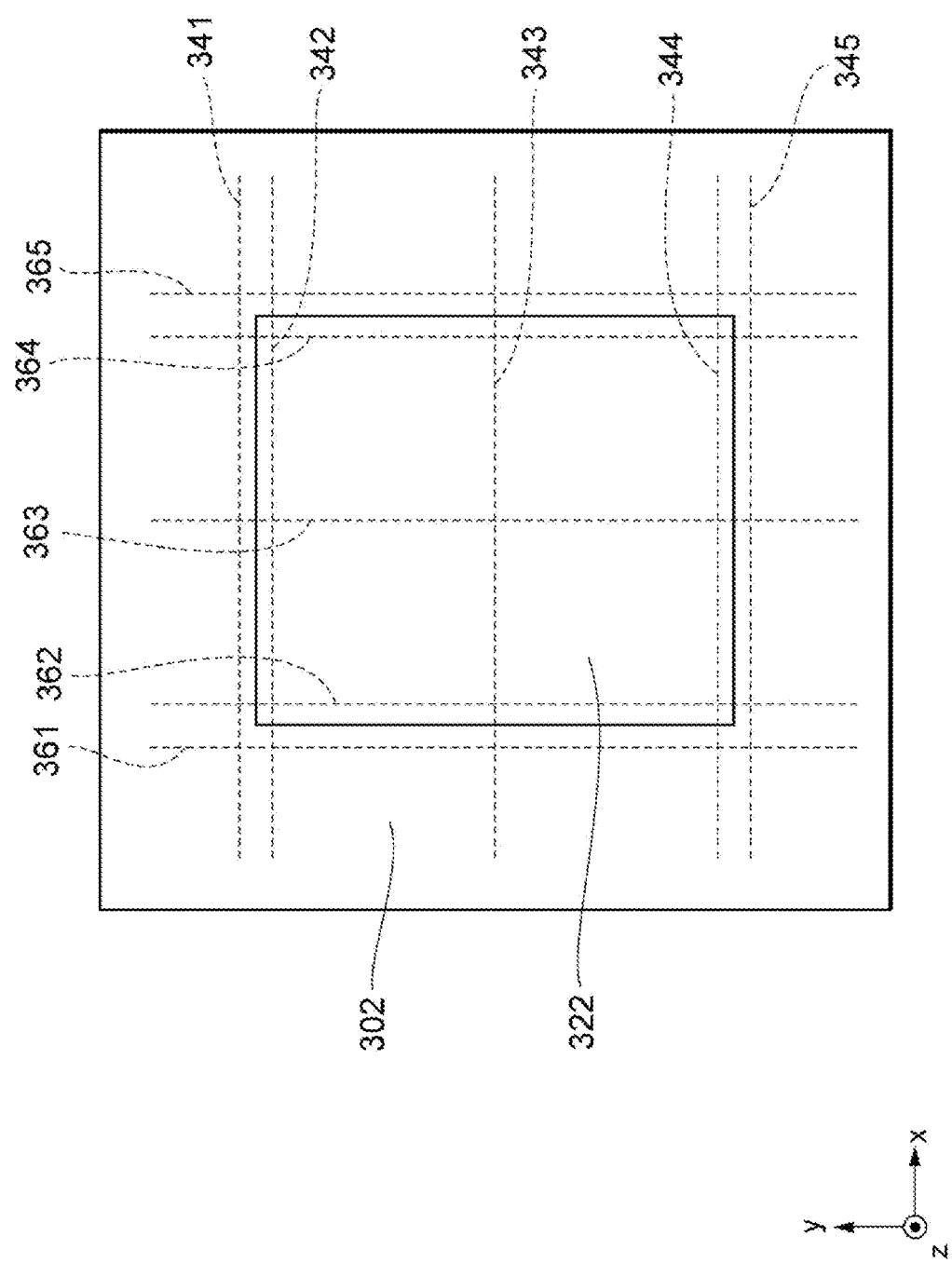
FIG. 4 is a diagram showing an example of the range measured by the measurement part according to the embodiment.

FIG. 4 is a diagram showing an example of the range measured by the measurement part 120 according to this embodiment. FIG. 4 shows a plan view of the main surface 302 of the substrate 300 from the positive direction to the negative direction of the z-axis.

A plurality of broken lines shown in FIG. 4 each indicate an example of the range that can be measured by the measurement part 120. Here, virtual lines 341 to 345 indicated by broken lines are virtual lines along the x-axis direction, and virtual lines 361 to 365 indicated by broken lines are virtual lines along the y-axis direction.

The measurement part 120 according to this embodiment may measure the chip height position and the substrate height position respectively at a plurality of measurement points along the x-axis direction or the y-axis direction (an example of the first direction) in the plan view of the main surface 302 of the substrate 300. For example, the measurement part 120 can measure the chip height position at a plurality of measurement points along the virtual line 342 passing through the upper surface 322 of the semiconductor chip. In addition, the measurement part 120 can measure the substrate height position at a plurality of measurement points along the virtual line 341 passing through only the non-mount region where no semiconductor chip is mounted.

In this embodiment, the measurement part 120 can measure the substrate height position at a plurality of measurement points along each of the virtual lines 341 and 345. In addition, the measurement part 120 can measure the substrate height position at a plurality of measurement points along each of the virtual lines 342 to 344.

In addition, the measurement part 120 can measure the chip height position and the substrate height position respectively at a plurality of measurement points along each of the x-axis direction and the y-axis direction (an example of the first direction and the second direction that intersects the first direction in the plan view). In this embodiment, the measurement part 120 can respectively measure the chip height position and the substrate height position at a plurality of measurement points along virtual lines 361 to 365 in addition to the virtual lines 341 to 345 described above. For example, the measurement part 120 can measure the substrate height position at a plurality of measurement points along the virtual lines 361 and 365. Further, the measurement part 120 can measure the chip height position at a plurality of measurement points along the virtual lines 362 to 364.

Moreover, a plurality of measurement points of the substrate height position may be located at positions extending along an edge of a mount region. In this embodiment, a plurality of measurement points along the virtual lines 341, 345, 361, and 365 are located at positions extending along the edge of the mount region. The plurality of measurement points are located at positions close to the mount region. Therefore, by using the height position measured at the plurality of measurement points, it is possible to more accurately estimate the state of the lower surface of the semiconductor chip.

Furthermore, the substrate 300 may have a plurality of semiconductor chips mounted thereon. In this case, the amount of deformation (warpage or inclination) of the substrate 300 and the thickness between the lower surface of the semiconductor chip and the main surface 302 of the substrate 300 may differ depending on where the semiconductor chip is mounted. At this time, if the plurality of measurement points to be measured are located at positions extending along the edge of the mount region, the height position corresponding to where the semiconductor chip is mounted can be used, and therefore, it is possible to estimate the state of the lower surface of the semiconductor chip more accurately.

Returning to FIG. 2, the functions of the estimation part 114 included in the measurement device 10 will be described. The estimation part 114 estimates position information related to the mount region of the main surface 302 of the substrate 300 where the semiconductor chip 320 is mounted based on the chip height position and the substrate height position measured by the measurement part 120. Here, the position information related to the mount region may be, for example, the height position of the main surface 302 of the substrate 300 in the mount region or the positional relationship between the substrate 300 and the semiconductor chip 320 (specifically, information related to the thickness between the lower surface of the semiconductor chip 320 and the main surface of the substrate 300).

Further, as described above, the measurement part 120 may measure the chip height position and the substrate height position respectively at a plurality of measurement points along the x-axis direction or the y-axis direction. In this case, the estimation part 114 can estimate the position information in directions along the x-axis direction or the y-axis direction based on the plurality of measurement points of each of the chip height position and the substrate height position measured by the measurement part 120. Thus, the measurement part 120 can estimate the state of the lower surface side of the semiconductor chip 320 in more detail. For example, the inclination of the semiconductor chip with respect to the substrate along the x-axis direction or the y-axis direction in the mount region, or the amount of deformation of the substrate (for example, the amount of deformation due to warpage) may be estimated.

In addition, as described above, the measurement part 120 may measure the chip height position and the substrate height position respectively at a plurality of measurement points along each of the x-axis direction and the y-axis direction. In this case, the estimation part 114 can estimate the position information in directions along each of the x-axis direction and the y-axis direction based on the plurality of measurement points of each of the chip height position and the substrate height position measured by the measurement part 120. Thus, the state of the lower surface side of the semiconductor chip is estimated in more detail.

Figure 5:
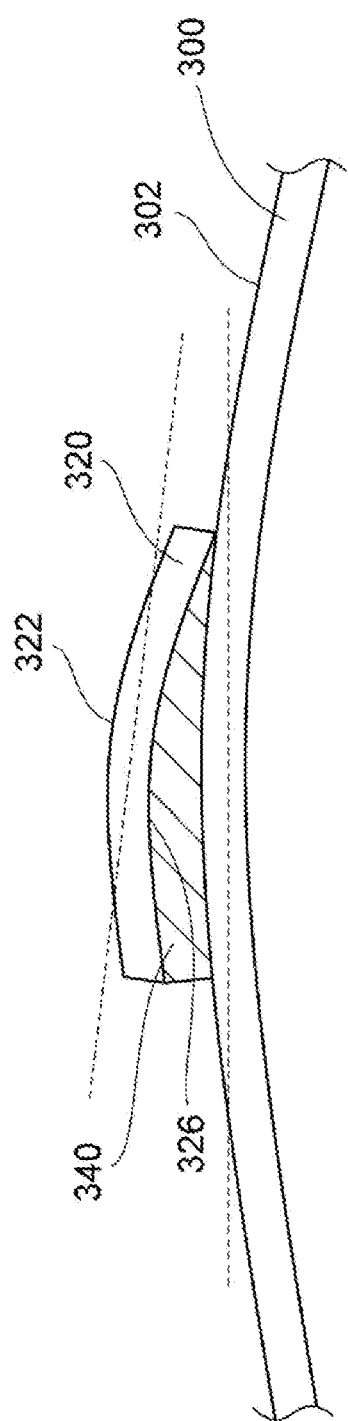
FIG. 5 is a diagram showing an example of the cross section of the substrate and the semiconductor chip.

The position information estimated by the estimation part 114 will be described in more detail with reference to FIG. 5. FIG. 5 is a diagram showing an example of a cross section of the substrate 300 and the semiconductor chip 320. Here, an example in which the substrate 300 and the semiconductor chip 320 are bonded via a connecting portion 340 will be described. The connecting portion 340 may be, for example, various solders or various resin adhesives. Also, NFC (Non Conductive Film) or the like may be used as the connecting portion 340.

For example, when the substrate 300 and the semiconductor chip 320 are bonded by solder, the solder is applied to the electrically connected portions of the substrate 300 and the semiconductor chip 320, and FIG. 5 schematically shows the solder connecting portion 340 provided on one surface between the lower surface 326 of the semiconductor chip 320 and the main surface 302 of the substrate 300.

As described above, when the semiconductor chip 320 is solder-bonded to the substrate 300, the substrate 300 and the semiconductor chip 320 are heated to melt the solder or the like. At this time, as the substrate 300 and the semiconductor chip 320 have different coefficients of thermal expansion, the substrate 300 and the semiconductor chip 320 are warped as shown in FIG. Thus, the thickness between the lower surface 326 of the semiconductor chip 320 and the main surface 302 of the substrate 300 may not be uniform, and the semiconductor chip 320 may be mounted in an inclined state with respect to the substrate 300. In the example shown in FIG. 5, the semiconductor chip 320 is generally tilted with respect to the substrate 300 (or the xy plane).

In the measurement method of irradiating light or the like, the thickness between the lower surface 326 of the semiconductor chip 320 and the main surface 302 of the substrate 300 cannot be directly measured, and it is difficult to directly measure the inclination between the substrate 300 and the semiconductor chip 320. However, the estimation part 114 according to this embodiment can estimate the inclination based on the chip height position and the substrate height position.

Specifically, the estimation part 114 can estimate the thickness between the lower surface of the semiconductor chip 320 and the main surface 302 of the substrate 300 in the mount region, or the inclination of the semiconductor chip 320 with respect to the substrate 300 using the relationship between a plurality of measurement points of the chip height position measured along the first direction and a plurality of measurement points of the substrate height position measured along the first direction.

Here, it is assumed that the degree of warpage of the substrate 300 in the non-mount region and the degree of warpage of the substrate 300 in the mount region are approximately the same. If this assumption holds, the estimation part 114 can estimate the thickness between the lower surface of the semiconductor chip 320 and the main surface 302 of the substrate 300 or the inclination of the semiconductor chip 320 with respect to the substrate 300 by calculating differences between a plurality of measurement points of the chip height position measured along the first direction and a plurality of measurement points of the substrate height position measured along the first direction.

Figure 6:
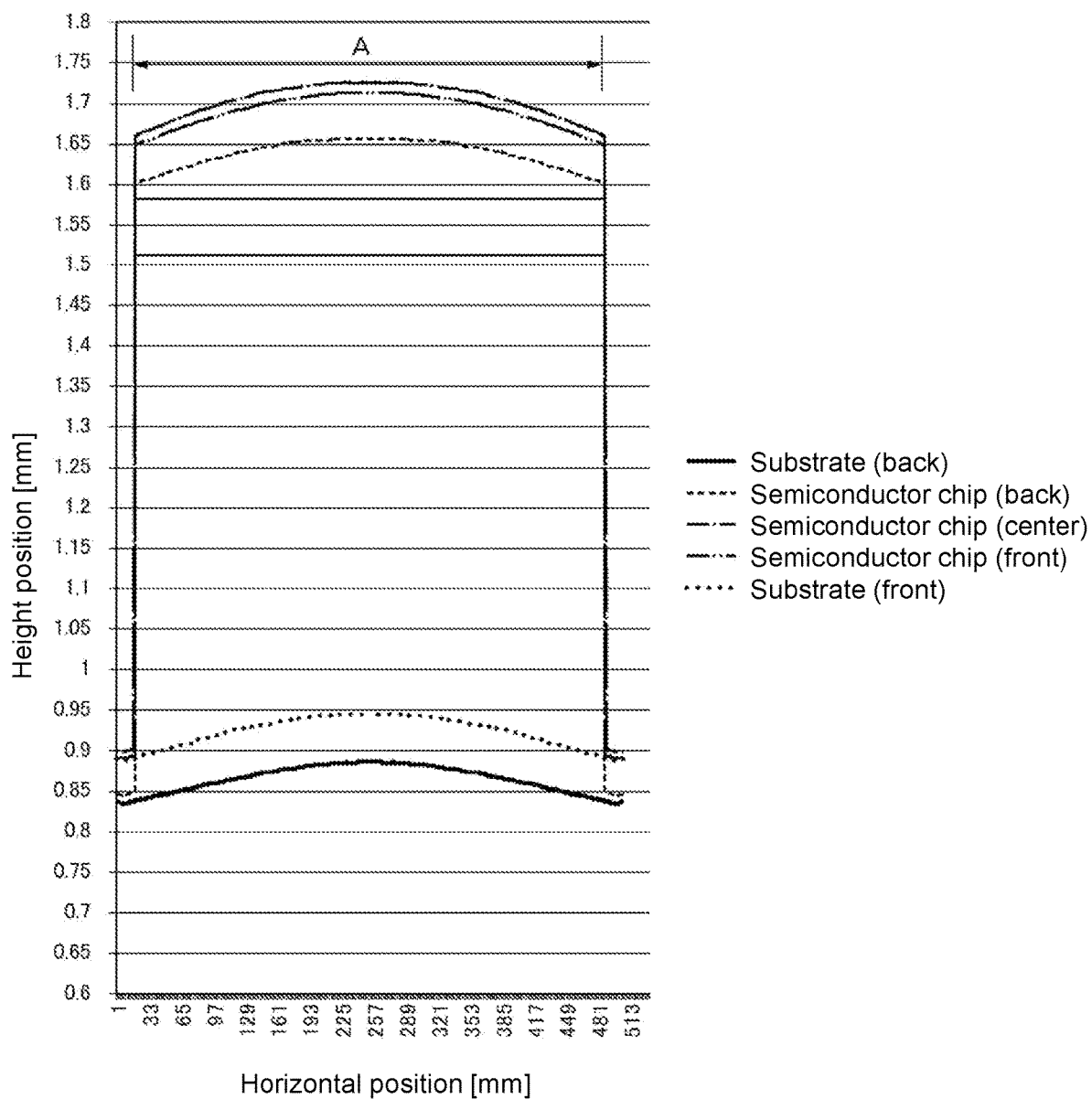
FIG. 6 is a diagram showing an example of the result of measuring the chip height position and the substrate height position respectively at a plurality of measurement points along the x-axis direction when there is no inclination between the semiconductor chip and the substrate.

FIG. 6 is a diagram showing an example of the result of measuring the chip height position and the substrate height position respectively at a plurality of measurement points along the x-axis direction when there is no inclination between the semiconductor chip and the substrate. In FIG. 6, the vertical axis indicates the height position (mm), and the horizontal axis indicates the horizontal position (mm) in the x-axis direction. The substrate (back), semiconductor chip (back), semiconductor chip (center), semiconductor chip (front), and substrate (front) shown in FIG. 6 respectively correspond to the virtual lines 341, 342, 343, 344, and 345 shown in FIG. 4. In addition, in the measurement results of the semiconductor chips (back), (center), and (front), the height position in the range A indicates the chip height position. Further, other height positions indicate the substrate height position.

It will be explained here that it is possible to estimate the inclination of the semiconductor chip with respect to the substrate. The chip height positions of the semiconductor chips (back), (center), and (front) measured include the thickness between the lower surface of the semiconductor chip and the main surface of the substrate, the thickness of the substrate, and the amount of deformation such as warpage of the substrate in addition to the thickness of the semiconductor chip. At this time, since it is not possible to measure the warpage of the substrate in the region (mount region) where the semiconductor chip is mounted, it is not possible to measure the thickness between the lower surface of the semiconductor chip and the main surface of the substrate.

The inventor has found that there is a high degree of similarity between the amount of deformation of the substrate in the periphery of the mount region (that is, the non-mount region) and the amount of deformation of the substrate in the mount region, and the amount of deformation of the substrate in the non-mount region and the amount of deformation of the substrate in the mount region are approximately the same. The inventor has also found that there exists a high degree of similarity in the amount of deformation regardless of the direction of line laser scanning (x-axis direction or y-axis direction).

For example, the degree of warpage in the substrate corresponding to the range A of the semiconductor chip (back) is approximately the same as the degree of warpage of the substrate in the substrate (back). Therefore, by calculating the difference between the chip height position of the semiconductor chip (back) and the substrate height position of the substrate (back), the thickness of the substrate and the amount of deformation of the substrate are subtracted from the substrate height position. Further, by subtracting the previously known thickness of the semiconductor chip from the difference, the thickness between the lower surface of the semiconductor chip and the main surface of the substrate and the inclination between the semiconductor chip and the substrate can be estimated.

In the measurement result of the substrate (back), the substrate height position is 0.89 mm at the left end (horizontal position: 20 mm) of the semiconductor chip, and the substrate height position is 0.89 mm at the right end (horizontal position: 480 mm) of the semiconductor chip. Further, in the measurement result of the semiconductor chip (back), the chip height position is 1.6 mm at the left end of the semiconductor chip, and the chip height position is 1.6 mm at the right end of the semiconductor chip. At these two ends, the differences between the chip height position and the substrate height position are both about 0.7 mm. Therefore, it is estimated that the semiconductor chip is not inclined with respect to the substrate.

Figure 7:
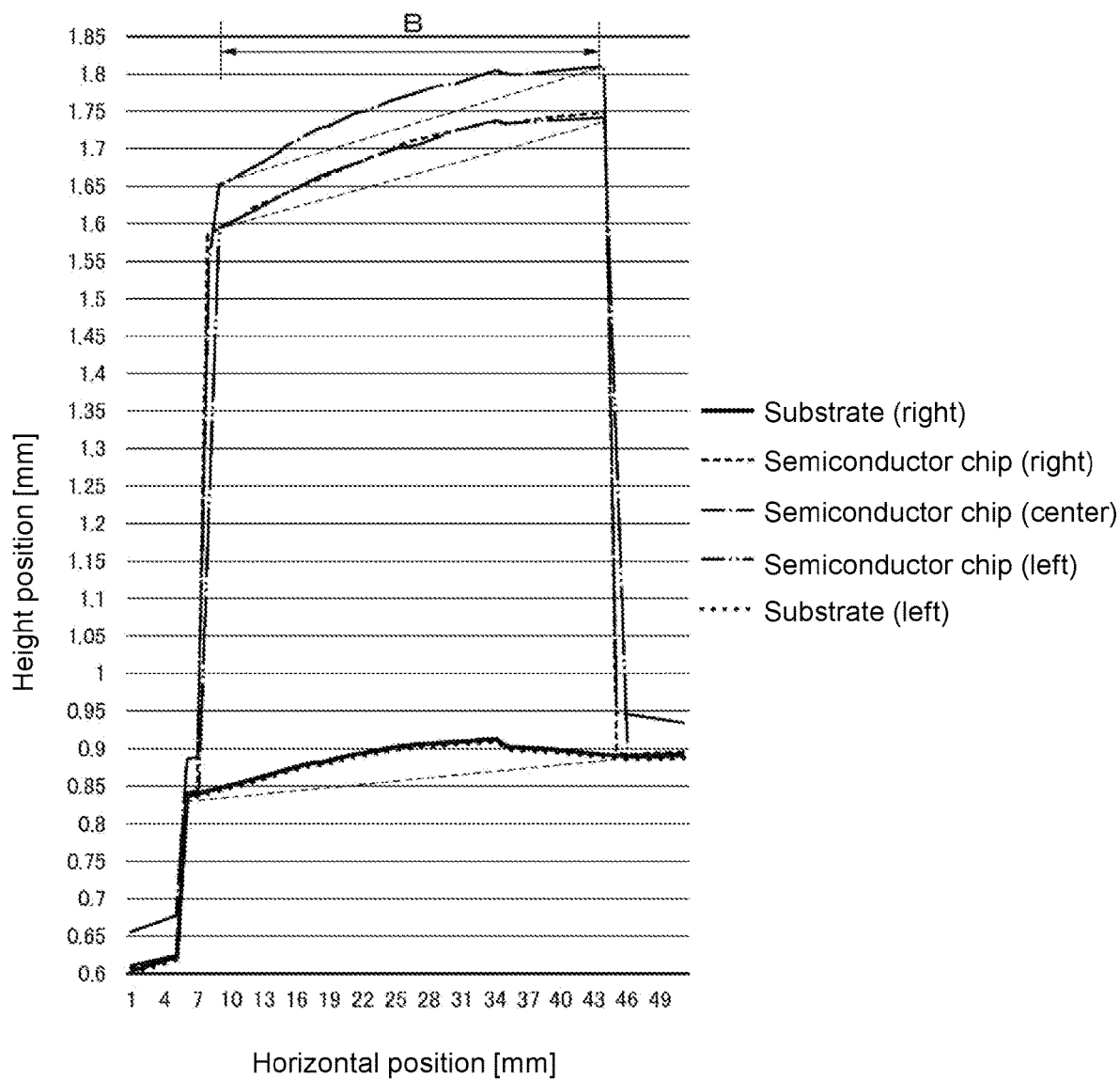
FIG. 7 is a diagram showing an example of the result of measuring the chip height position and the substrate height position respectively at a plurality of measurement points along the y-axis direction when there is inclination between the semiconductor chip and the substrate.

FIG. 7 is a diagram showing an example of the result of measuring the chip height position and the substrate height position respectively at a plurality of measurement points along the y-axis direction when there is inclination between the semiconductor chip and the substrate. Here, the substrate and the semiconductor chip for the measurement result shown in FIG. 7 are different from the substrate and the semiconductor chip for the measurement result shown in FIG. 6.

In FIG. 7, the vertical axis indicates the height position (mm), and the horizontal axis indicates the horizontal position (mm) in the y-axis direction. The substrate (right), semiconductor chip (right), semiconductor chip (center), semiconductor chip (left), and substrate (left) shown in FIG. 7 respectively correspond to virtual lines 365, 364, 363, 362, and 361 shown in FIG. 4. In addition, in the measurement results of the semiconductor chips (right), (center), and (left), the height position in the range B indicates the chip height position. Further, other height positions indicate the substrate height position.

As described with reference to FIG. 6, it is possible to estimate the inclination of the semiconductor chip with respect to the substrate based on the difference between the chip height position and the substrate height position. Specifically, based on the difference between the chip height position and the substrate height position shown in FIG. 7, it can be estimated that the semiconductor chip is inclined with respect to the substrate.

The fact that it is possible to estimate the inclination of the semiconductor chip with respect to the substrate will be explained using the measurement results of the substrate (right) and the semiconductor chip (center). According to the measurement result of the substrate (right), the substrate height position is 0.85 mm at the end (horizontal position: 9 mm) on the front side of the semiconductor chip, and the substrate height position is 0.90 mm at the end (horizontal position: 43 mm) on the back side of the semiconductor chip. In addition, in the measurement result of the semiconductor chip (center), the chip height position is 1.65 mm at the end on the front side of the semiconductor chip, and the chip height position is 1.80 mm at the end on the back side of the semiconductor chip. At these two ends, the difference between the chip height position and the substrate height position is 0.8 mm at the end on the front side and 0.9 mm at the end on the back side. Since the difference between the chip height position and the substrate height position differs between the end on the front side and the end on the back side of the semiconductor chip, it is estimated that the semiconductor chip is inclined with respect to the substrate.

Returning to FIG. 2, the storage part 130 of the measurement device 10 will be described. The storage part 130 includes, for example, a ROM storing programs to be executed by the processor 110 (specifically, the controller 112 and the estimation part 114), and a RAM used as a work memory or the like when the processor 110 executes processing. Further, the storage part 130 may have a non-volatile memory such as an HDD (Hard Disc Drive) and a flash memory (SSD: Solid State Drive). Thus, the storage part 130 can store the measurement result of the measurement part 120 and the position information, etc. estimated by the estimation part 114.

Figure 8:
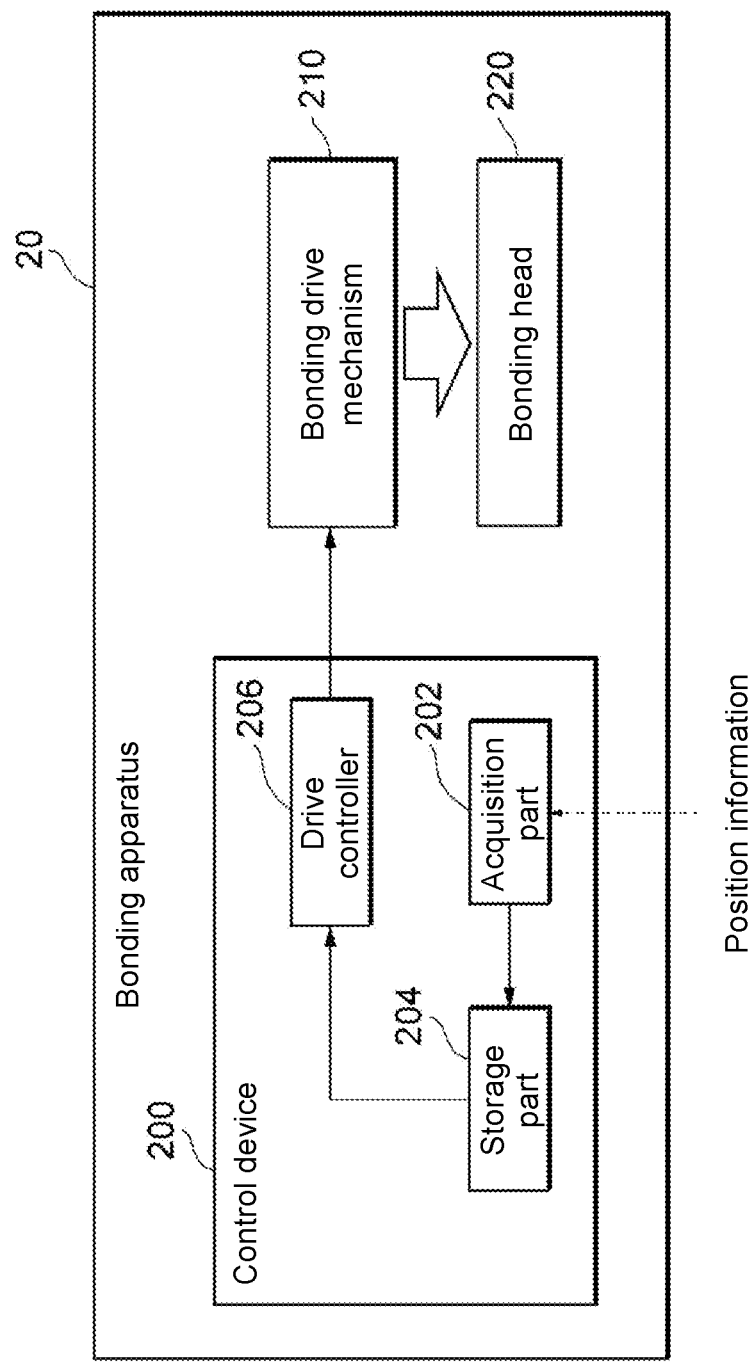
FIG. 8 is a functional block diagram showing an example of the functions of the bonding apparatus according to an embodiment of the disclosure.

Details of the bonding apparatus 20 will be described with reference to FIG. 8. The bonding apparatus 20 acquires the position information estimated by the measurement device 10, adjusts the inclination between the semiconductor chip and the substrate based on the acquired position information, and bonds the semiconductor chip and the substrate. FIG. 8 is a functional block diagram showing an example of the functions of the bonding apparatus 20 according to this embodiment. The bonding apparatus 20 includes a control device 200, a bonding drive mechanism 210, and a bonding head 220.

The control device 200 can control the driving of the bonding drive mechanism 210 to which the bonding head 220 is connected. Functions of the control device 200 are implemented by an acquisition part 202, a storage part 204, and a drive controller 206.

The acquisition part 202 may have various configurations, and may be, for example, various interfaces connected to other devices (for example, the measurement device 10 or a recording medium or the like storing the position information, etc.). In addition, the acquisition part 202 may be connected to another device via a network such as the Internet.

The acquisition part 202 can acquire various types of information from an external device and transmit the information to the storage part 204. In this embodiment, the acquisition part 202 may acquire information such as the position information estimated by the measurement device 10.

The storage part 204 has, for example, a ROM storing programs to be executed by the drive controller 206, and a RAM used as a work memory or the like when the drive controller 206 executes processing. Furthermore, the storage part 204 may have a non-volatile memory such as an HDD and a flash memory. Thus, the storage part 204 can store the position information, etc. acquired by the acquisition part 202.

The drive controller 206 includes a CPU, a ROM, a RAM, etc. The ROM included in the drive controller 206 stores processing programs or the like for executing various types of processing. Further, the CPU executes the processing programs or the like stored in the ROM to execute various types of processing. The RAM included in the drive controller 206 stores data temporarily used during execution of various programs.

The drive controller 206 acquires the position information estimated by the measurement device 10, and controls the driving of the bonding drive mechanism 210 based on the acquired position information. By controlling the driving of the bonding drive mechanism 210, the position and orientation of the bonding head 220 connected to the bonding drive mechanism 210 are controlled. At this time, the semiconductor chip sucked to the lower surface of the bonding head 220 is placed on a substrate arranged on a stage or the like. Afterwards, the substrate and the semiconductor chip are heated by a heater (not shown), so that the solder provided on the semiconductor chip, for example, is melted, and the semiconductor chip is bonded to the substrate.

When the semiconductor chip is placed on the substrate, the inclination between the semiconductor chip and the substrate is adjusted based on the position information estimated by the measurement device 10. For example, it is assumed that it is known based on the position information that the semiconductor chip tends to incline in a predetermined direction from the substrate during mounting. In this case, the bonding apparatus 20 can, for example, adjust the inclination between the semiconductor chip and the substrate to cancel the inclination and adjust the inclination between the semiconductor chip and the substrate for bonding, thereby mounting the semiconductor chip and the substrate in parallel.

Figure 9:
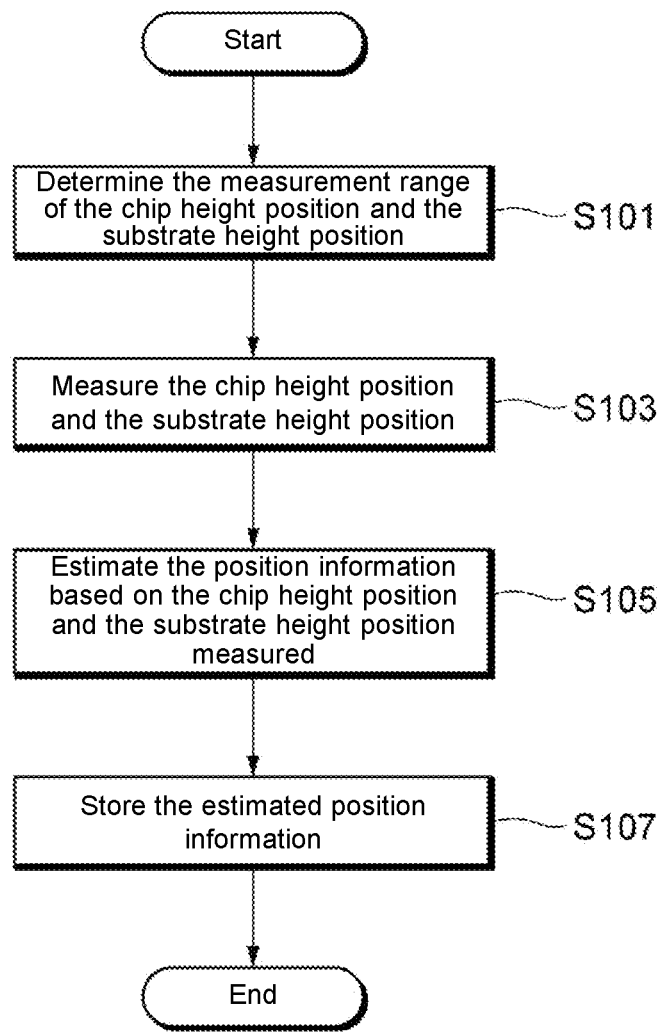
FIG. 9 is a flowchart showing an example of the measurement method performed by the measurement device according to the embodiment.

FIG. 9 is a flowchart showing an example of a measurement method performed by the measurement device 10 according to this embodiment. An example of the measurement method performed by the measurement device 10 will be described below with reference to FIG. 9.

First, the input part 100 determines the measurement range of the chip height position and the substrate height position based on the input operation or the like of the user (step S101). The determined measurement range is transmitted to the controller 112.

Next, the measurement part 120 measures the chip height position and the substrate height position within the range determined in step S101 under the control of the controller 112 (step S103). Next, the estimation part 114 estimates the position information based on the chip height position and the substrate height position measured in step S103 (step S105). Finally, the storage part 130 stores the estimated position information (step S107).

Figure 10:
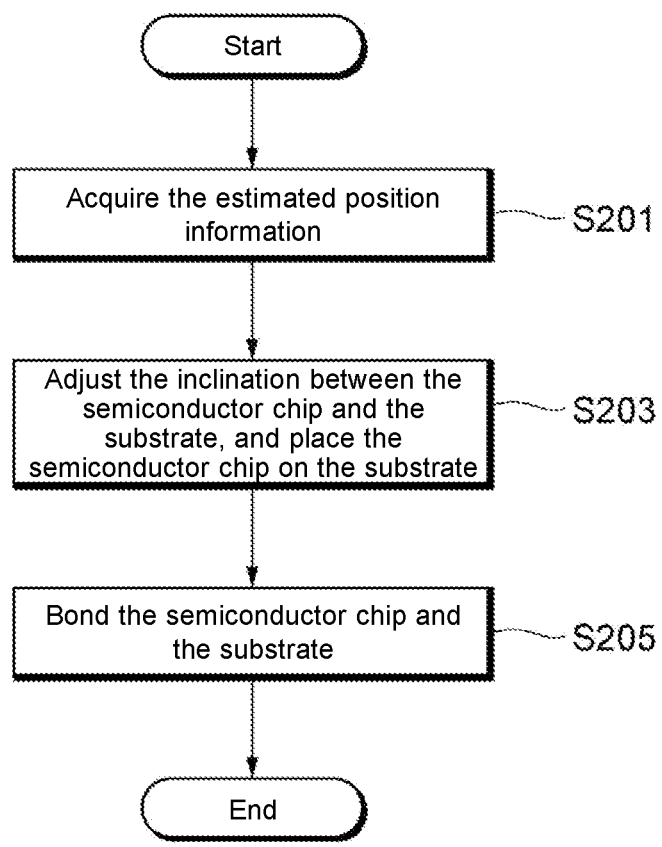
FIG. 10 is a flowchart showing an example of the bonding method performed by the bonding apparatus according to the embodiment.

FIG. 10 is a flowchart showing an example of a bonding method performed by the bonding apparatus 20 according to this embodiment. An example of the bonding method performed by the bonding apparatus 20 will be described below with reference to FIG. 10.

First, the acquisition part 202 acquires the position information estimated by the measurement device 10 (step S201). The acquired position information may be stored in the storage part 204.

Next, the drive controller 206 controls the driving of the bonding drive mechanism to control the inclination between the semiconductor chip and the substrate, and place the semiconductor chip on the substrate (step S203). Finally, the bonding apparatus 20 bonds the semiconductor chip and the substrate (step S205). For example, a heater included in the bonding apparatus 20 may heat the semiconductor chip and the substrate, thereby bonding the semiconductor chip and the substrate by soldering.

The embodiments described above are provided to facilitate understanding of the present invention, and are not intended to limit and interpret the present invention. Each element included in the embodiments and its arrangement, material, condition, shape, size, etc. are not limited to those illustrated and can be changed as appropriate. In addition, it is possible to partially replace or combine the configurations shown in different embodiments.

The above embodiment illustrates an example in which the second direction (y-axis direction) is orthogonal to the first direction (x-axis direction), but the second direction may intersect the first direction at an angle.

Further, the above embodiment illustrates an example in which the measurement part 120 measures the substrate height position and the chip height position along two directions (the first direction and the second direction), but the measurement part 120 may measure the substrate height position and the chip height position along one direction or along three or more directions. If the measurement part 120 performs measurement along three or more directions, the three or more directions may intersect one another.

Moreover, the semiconductor chip may have a laminated structure formed of a plurality of layers. In this case, the bonding apparatus 20 may mount the semiconductor chip on the substrate by stacking and mounting the layers on the substrate one by one. At this time, the bonding apparatus 20 may adjust the inclination of the layer to be stacked with respect to the substrate or the inclination of the layer to be stacked with respect to an already mounted layer.

The above embodiment illustrates an example in which the bonding apparatus 20 bonds the semiconductor chip and the substrate by flip-chip bonding. The present invention is not limited thereto, and the bonding apparatus 20 may bond the semiconductor chip and the substrate by wire bonding that connects the semiconductor chip and the substrate using fine metal wires.

Further, the above embodiment illustrates an example in which the measurement part 120 measures the chip height position at a plurality of measurement points on three lines (for example, virtual lines 342, 343, and 344) along the first direction. The present invention is not limited thereto, and the measurement part 120 may measure the chip height position at a plurality of measurement points on one, two, or four or more lines along the first direction. At this time, if the chip height position is measured on four or more lines, the state of the lower surface side of the semiconductor chip can be estimated in more detail than in the above embodiment.

What is claimed is:

1. A measurement device for performing measurement on an electronic component mounted on a main surface of a substrate, the measurement device comprising:
    a measurement part measuring a component height position, which is a height position of an upper surface of the electronic component, and a substrate height position, which is a height position of a non-mount region of the main surface of the substrate where the electronic component is not mounted; and
    an estimation part estimating position information between a lower surface of the electronic component and the main surface of the substrate in a mount region based on the component height position and the substrate height position measured by the measurement part,
    wherein the measurement part measures the component height position and the substrate height position after the electronic component is mounted on the main surface of the substrate and
    wherein the position information comprises information related to inclination of the electronic component with respect to the substrate in the mount region.

2. The measurement device according to claim 1, wherein the measurement part measures the component height position and the substrate height position respectively at a plurality of measurement points along a first direction in a plan view of the main surface of the substrate, and
    the estimation part estimates the position information in a direction along the first direction based on the plurality of measurement points of each of the component height position and the substrate height position measured by the measurement part.

3. The measurement device according to claim 2, wherein the measurement part respectively measures the component height position and the substrate height position at a plurality of measurement points along a direction of each of the first direction and a second direction intersecting the first direction in the plan view, and
    the estimation part estimates the position information in a direction along each of the first direction and the second direction based on the plurality of measurement points of each of the component height position and the substrate height position measured by the measurement part.

4. The measurement device according to claim 2, wherein the plurality of measurement points of the substrate height position are located at positions extending along an edge of the mount region.

5. The measurement device according to claim 1, wherein the measurement part measures the component height position by irradiating the upper surface of the electronic component with light and detecting reflected light from the upper surface of the electronic component, and measures the substrate height position by irradiating the non-mount region with light and detecting reflected light from the non-mount region.

6. A bonding system, comprising:
    the measurement device according to claim 1; and
    a bonding apparatus acquiring the position information estimated by the measurement device, adjusting inclination between the electronic component and the substrate based on the position information acquired, and bonding the electronic component and the substrate.

7. The measurement device according to claim 3, wherein the plurality of measurement points of the substrate height position are located at positions extending along an edge of the mount region.

8. The measurement device according to claim 2, wherein the measurement part measures the component height position by irradiating the upper surface of the electronic component with light and detecting reflected light from the upper surface of the electronic component, and measures the substrate height position by irradiating the non-mount region with light and detecting reflected light from the non-mount region.

9. The measurement device according to claim 3, wherein the measurement part measures the component height position by irradiating the upper surface of the electronic component with light and detecting reflected light from the upper surface of the electronic component, and measures the substrate height position by irradiating the non-mount region with light and detecting reflected light from the non-mount region.

10. The measurement device according to claim 4, wherein the measurement part measures the component height position by irradiating the upper surface of the electronic component with light and detecting reflected light from the upper surface of the electronic component, and measures the substrate height position by irradiating the non-mount region with light and detecting reflected light from the non-mount region.

11. A measurement method for performing measurement on an electronic component mounted on a main surface of a substrate, the measurement method comprising:
    measuring a component height position, which is a height position of an upper surface of the electronic component, and a substrate height position, which is a height position of a non-mount region of the main surface of the substrate where the electronic component is not mounted; and estimating position information between a lower surface of the electronic component and the main surface of the substrate in a mount region based on the component height position and the substrate height position measured, wherein the measuring step of measuring the component height position and the substrate height position is performed after the electronic component is mounted on the main surface of the substrate and wherein the position information comprises information related to inclination of the electronic component with respect to the substrate in the mount region.

* * * * *